United States Patent
Hetzl et al.

(10) Patent No.: US 12,407,147 B2
(45) Date of Patent: Sep. 2, 2025

(54) EDGE-EMITTING SEMICONDUCTOR LASER DIODE AND METHOD OF MANUFACTURING THE SAME

(71) Applicant: OSRAM Opto Semiconductors GmbH, Regensburg (DE)

(72) Inventors: Martin Hetzl, Pettendorf (DE); Petrus Sundgren, Lappersdorf (DE); Jens Ebbecke, Rohr in Niederbayern (DE); Uwe Strauß, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 851 days.

(21) Appl. No.: 17/596,642

(22) PCT Filed: Jul. 9, 2020

(86) PCT No.: PCT/EP2020/069411
§ 371 (c)(1),
(2) Date: Dec. 15, 2021

(87) PCT Pub. No.: WO2021/009006
PCT Pub. Date: Jan. 21, 2021

(65) Prior Publication Data
US 2022/0102941 A1   Mar. 31, 2022

(30) Foreign Application Priority Data
Jul. 12, 2019   (DE) .................. 102019118993.4

(51) Int. Cl.
*H01S 5/10*   (2021.01)
*H01S 5/02*   (2006.01)
(Continued)

(52) U.S. Cl.
CPC ............ *H01S 5/209* (2013.01); *H01S 5/0206* (2013.01); *H01S 5/0282* (2013.01);
(Continued)

(58) Field of Classification Search
CPC ...... H01S 5/209; H01S 5/0206; H01S 5/0282; H01S 5/0287; H01S 5/106; H01S 5/34313; H01S 5/0201; H01S 5/2086; H01S 5/168
See application file for complete search history.

(56) References Cited

U.S. PATENT DOCUMENTS 4,546,480 A * 10/1985 Burnham ................ H01L 27/15
                                                          372/50.1
5,976,904 A    11/1999 Gotoh et al.
(Continued)

FOREIGN PATENT DOCUMENTS

DE    102008025922 A1   12/2009
DE    102013211851 A1   12/2014
(Continued)

OTHER PUBLICATIONS

Yamagata, Y., et al., "915nm high-power broad area laser diodes with ultra-small optical confinement based on Asymmetric Decoupled Confinement Heterostructure (ADCH)," Proceedings of SPIE—The International Society for Optical Engineering; vol. 9348; Mar. 2015, 11 pages.

*Primary Examiner* — Xinning (Tom) Niu
(74) *Attorney, Agent, or Firm* — Slater Matsil, LLP

(57) ABSTRACT

In an embodiment, an edge-emitting semiconductor laser diode includes a growth substrate, a semiconductor layer sequence located on the growth substrate, the semiconductor layer sequence having an active layer and an etch stop layer and two facets located opposite each other, wherein the facets bound the semiconductor layer sequence in a lateral direction, wherein the semiconductor layer sequence includes two edge regions adjoining the facets and a central region directly adjoining both edge regions, wherein, within each of the edge regions, a volume fraction of the active layer in the semiconductor layer sequence is smaller than in
(Continued)

the central region, wherein the active layer is spaced apart from one facet, wherein a distance of the active layer to the facet varies along a direction parallel to this facet, and wherein the etch stop layer is arranged between the growth substrate and the active layer.

16 Claims, 11 Drawing Sheets

(51) Int. Cl.
    *H01S 5/028*     (2006.01)
    *H01S 5/20*     (2006.01)
    *H01S 5/343*     (2006.01)

(52) U.S. Cl.
    CPC ............ *H01S 5/0287* (2013.01); *H01S 5/106* (2013.01); *H01S 5/34313* (2013.01)

(56) References Cited

U.S. PATENT DOCUMENTS

| | | | |
|---|---|---|---|
| 6,379,870 B1* | 4/2002 | Dunne | H01L 21/76814 430/311 |
| 9,812,844 B2 | 11/2017 | Gomez-Iglesias et al. | |
| 2004/0105474 A1* | 6/2004 | Ohkubo | H01S 5/22 372/46.01 |
| 2004/0136427 A1* | 7/2004 | Hashimoto | H01S 5/227 372/46.01 |
| 2005/0232327 A1* | 10/2005 | Nomura | B82Y 20/00 372/50.12 |
| 2007/0108456 A1* | 5/2007 | Wong | H01L 33/04 257/E29.091 |
| 2007/0217465 A1* | 9/2007 | Hashimoto | H01S 5/343 372/50.11 |
| 2009/0103584 A1* | 4/2009 | Vaccaro | H01S 5/34333 438/33 |
| 2013/0343419 A1 | 12/2013 | Lell et al. | |
| 2015/0349496 A1 | 12/2015 | Miyasaka | |

FOREIGN PATENT DOCUMENTS

| | | |
|---|---|---|
| EP | 0875968 A2 | 11/1998 |
| JP | H06338657 A | 12/1994 |
| JP | 2001024281 A | 1/2001 |
| JP | 2003017809 A | 1/2003 |

\* cited by examiner

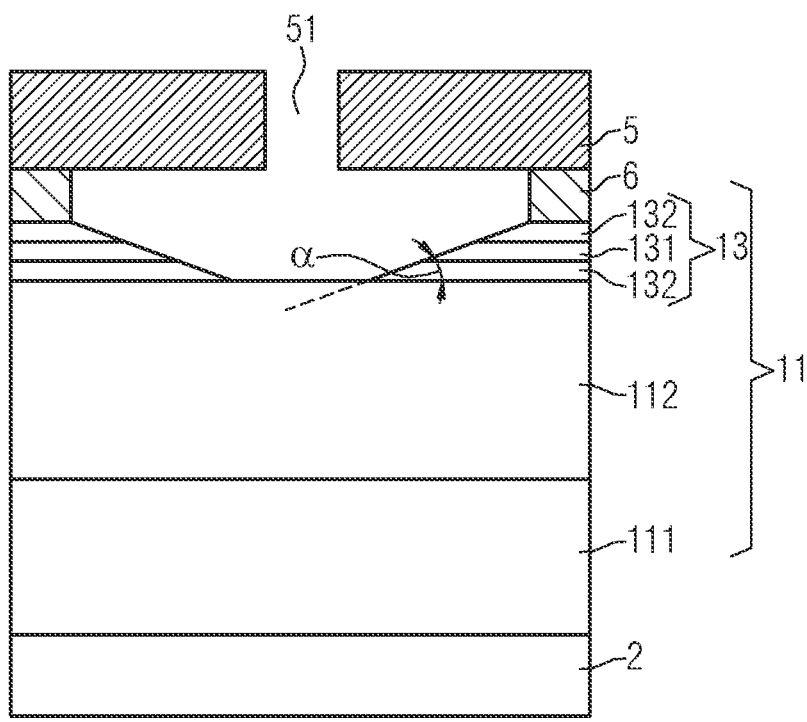
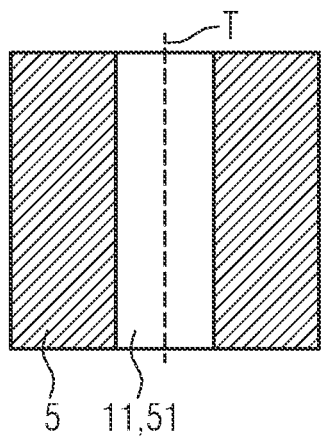 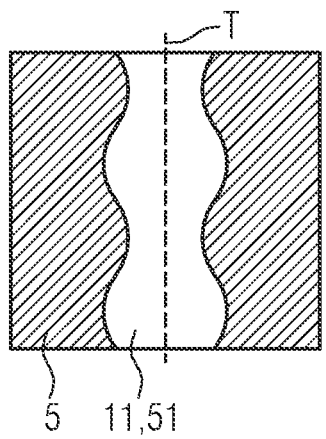 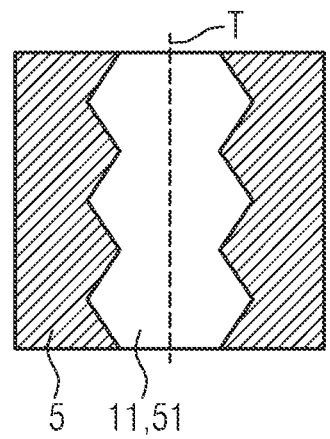

EDGE-EMITTING SEMICONDUCTOR LASER DIODE AND METHOD OF MANUFACTURING THE SAME

This patent application is a national phase filing under section 371 of PCT/EP2020/069411, filed Jul. 9, 2020, which claims the priority of German patent application 102019118993.4, filed Jul. 12, 2019, each of which is incorporated herein by reference in its entirety.

TECHNICAL FIELD

The invention relates to an edge-emitting semiconductor laser diode. Furthermore, the invention relates to a method of manufacturing an edge-emitting semiconductor laser diode.

SUMMARY

Embodiments provide an edge-emitting semiconductor laser diode which is characterized by a particularly low failure rate. Further embodiments provide a method for manufacturing such an edge-emitting semiconductor laser diode.

According to at least one embodiment of the edge-emitting semiconductor laser diode, the edge-emitting semiconductor laser diode comprises a growth substrate. For example, the growth substrate comprises a semiconductor material, such as Si, or a semiconductor compound material, such as GaAs or GaN. In particular, the growth substrate is doped, such as n-doped or p-doped. Preferably, the growth substrate comprises or is formed from n-doped GaAs.

According to at least one embodiment of the edge-emitting semiconductor laser diode, the edge-emitting semiconductor laser diode comprises, on the growth substrate, a semiconductor layer sequence having an active layer. The semiconductor layer sequence is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, with $0 \leq n \leq 1$, $0 \leq m \leq 1$, and $m+n \leq 1$ in each case. Alternatively, the semiconductor material may be an antimonide compound semiconductor material. The semiconductor layer sequence may comprise dopants as well as additional components. However, for simplicity, only the essential constituents of the crystal lattice of the semiconductor layer sequence, i.e. Al, As, Ga, In, N or P, are indicated, even if these may be partially replaced and/or supplemented by small amounts of further substances. Preferably, the semiconductor layer sequence is based on AlGaAs.

The active layer serves to generate electromagnetic radiation. In particular, the active layer includes at least one quantum well structure in the form of a single quantum well, SQW for short, or in the form of a multi-quantum well structure, MQW for short. Additionally, the active layer includes one, preferably more, secondary well structures. Preferably, the semiconductor layer sequence comprises one, in particular exactly one, contiguous active layer. For example, the active layer comprises In. In particular, only the active layer comprises In, while the rest of the semiconductor layer sequence is free of In.

For example, the semiconductor laser diode generates electromagnetic radiation in the blue or green or red spectral range or in the UV range during intended operation. Preferably, radiation in the IR range is generated.

For example, the semiconductor layer sequence comprises a p-type material and an n-type material, the active layer being arranged between the p-type material and the n-type material. For example, the n-type material is arranged on the side of the active layer facing the growth substrate. Alternatively, the n-type material is arranged on the side of the active layer facing away from the growth substrate.

In particular, the p-type material and the n-type material each comprise a cladding layer and a waveguide layer, the waveguide layers each adjoining the active layer. Alternatively, the waveguide layers may be undoped.

According to at least one embodiment, the edge-emitting semiconductor laser diode comprises two facets located opposite each other, the facets bounding the semiconductor layer sequence in a lateral direction. "Lateral direction" is understood here and in the following to denote a direction that is parallel to a main extension plane of the semiconductor layer sequence. For example, the facets extend transversely, preferably perpendicularly, to the main extension plane of the semiconductor layer sequence. In particular, the facets form side surfaces of the semiconductor layer sequence. A semiconductor laser diode is preferably formed by singulation from a wafer composite. The facets are then formed by the fracture edges from the separation process.

Preferably, the edge-emitting semiconductor laser diode emits a majority of its total emitted radiation via one or both facets. In particular, the semiconductor laser diode emits more than 50% or more than 70% or more than 85% of its total emitted radiation via at least one facet in the form of laser radiation. In particular, a portion of the light is reflected at the facets. A laser resonator is thus formed between the facets, while the semiconductor layer sequence forms the active laser medium of the semiconductor laser diode.

A semiconductor laser diode is understood here and in the following to be a separately manageable and electrically contactable element. A semiconductor laser diode preferably comprises exactly one originally contiguous section of the semiconductor layer sequence grown in the wafer composite. The semiconductor layer sequence of the semiconductor laser diode is preferably formed contiguously. A lateral extent of the semiconductor laser diode, measured parallel to the main extension plane of the semiconductor layer sequence, is, for example, at most 5% or at most 10% greater than the lateral extent of the semiconductor layer sequence.

According to at least one embodiment, the semiconductor layer sequence comprises two edge regions adjoining the facets and a central region directly adjoining both edge regions. In particular, the central region is thus arranged between the two edge regions. Preferably, an extent of the edge regions as well as of the central region in directions parallel to the facets corresponds in each case to an extent of the semiconductor layer sequence in the same direction. In particular, virtual partition lines separating the central region from the edge regions and thus marking the boundary of the regions extend perpendicularly to the main extension plane of the semiconductor layer sequence or parallel to the facets. Measured in the direction perpendicular to the facets, the edge regions each have a width of, for example, at least 1 μm or at least 2 μm or at least 5 μm or at least 10 μm or at least 20 μm or at least 50 μm. Alternatively or additionally, the width is at most 100 μm in each case.

According to at least one embodiment, a volume fraction of the active layer in the semiconductor layer sequence is smaller within each of the edge regions than in the central region. For example, the volume fraction of the active layer within the edge regions is at most two thirds as large or at most half as large or at most one third as large as in the central region. For example, the active layer has a smaller average or maximum thickness within each of the edge regions, measured as an extent perpendicular to the main extension plane of the semiconductor layer sequence, than in the central region. For example, the maximum thickness in the edge regions is less than the average thickness in the central region. Alternatively or additionally, the active layer exhibits fewer quantum wells in the edge regions than in the central region. For example, in the case where only the active layer includes In, an indium content of the semiconductor layer sequence within each of the edge regions is less, for example at most half, than in the central region.

In at least one embodiment, the edge-emitting semiconductor laser diode comprises a growth substrate, a semiconductor layer sequence having an active layer on the growth substrate, and two facets located opposite each other. The facets bound the semiconductor layer sequence in a lateral direction. The semiconductor layer sequence comprises two edge regions adjoining the facets and a central region directly adjoining both edge regions. Within each of the edge regions, a volume fraction of the active layer in the semiconductor layer sequence is smaller than in the central region.

An edge-emitting semiconductor laser diode described herein is based on the following considerations, among others. To achieve a low failure rate of the semiconductor laser diode, it is necessary to avoid stresses on the facets, such as thermal stresses and strains. Such stresses can occur due to high temperatures caused by high power densities and luminous and non-luminous recombination in the active layer near the facets. These high temperatures can also lead to thermally induced strains between the semiconductor layer sequence and adjacent materials, such as mirrors. Failure of the device in the area of the mirrors is referred to as "catastrophic optical mirror damage" (COMD).

In order to reduce the stress on the facets, the excitation of the active layer in the area of the facets could be suppressed. For example, in so-called "impurity-induced intermixing", foreign atoms such as Zn or Si are introduced in the area of the facets in the active layer by means of diffusion. The foreign atoms reduce the conductivity and the recombination rate in this area due to an increased band gap. Alternatively, so-called "impurity-free intermixing" can be used to achieve intermixing of the active layer with the adjacent semiconductor material. This increases, for example, the band gap in the area of the intermixing, which in turn can reduce the recombination rate.

An alternative way to reduce the stress on the facets is to prevent the active layer from being energized in the area of the facets. For example, an additional insulating layer is introduced within the semiconductor layer sequence in the area of the facets for this purpose. Thus, the power density in the area of the facets can be reduced.

In another alternative, the semiconductor layer sequence can be etched several micrometers deep in the area of the facets. In this process, the active layer is removed. Subsequently, the etched areas can be overgrown and filled again, but an active layer is not applied again. However, due to different growth behavior at the etched edges, this leads to severe interfacial defects and thickness fluctuation in the etched areas. This can adversely affect both the propagation of the light generated in the active layer within the semiconductor laser diode and the stability of the semiconductor laser diode as such.

The edge-emitting semiconductor laser diode described here makes use, among other things, of the idea of reducing the volume fraction of the active layer in the semiconductor layer sequence in the area of the facets. At the same time, thickness fluctuations and interface defects are avoided. Advantageously, this leads to a lower recombination and thus to lower power densities and consequently to a lower temperature of the semiconductor laser diode in the area of the facets. This reduces the failure rate of the semiconductor laser diode. Advantageously, the introduction of foreign atoms by diffusion can be omitted. This requires high temperatures, which can degenerate the semiconductor material. A further advantage arises in comparison with components with a current restriction, since absorption of light in the active layer in the area of the facets cannot be prevented in this case.

According to at least one embodiment of the edge-emitting semiconductor laser diode, the average thickness of the semiconductor layer sequence within the edge regions differs from the average thickness in the central region by at most 50 nm or at most 20 nm in each case. Here, "average thickness" means the averaged extent of the semiconductor layer sequence perpendicular to the main extension plane. Alternatively or additionally, the average thickness of the semiconductor layer sequence within the edge regions differs in each case by at most one quarter, in particular one eighth, of the wavelength of the light emitted by the semiconductor laser diode in the semiconductor layer sequence. The difference is thus, for example, at most $\lambda/(4n)$, in particular at most $\lambda/(8n)$, where $\lambda$ is the wavelength of the light emitted by the semiconductor laser diode and n is the refractive index of the semiconductor layer sequence at the wavelength $\lambda$. Advantageously, a semiconductor laser diode in which the average thickness of the semiconductor layer sequence has such a small variation exhibits a particularly high stability.

According to at least one embodiment, the active layer tapers in each case in the direction towards the facets. In particular, the active layer has a substantially constant thickness within the central region. Within the edge regions, the thickness of the active layer then decreases, for example, starting from the central region towards each of the facets. For example, the active layer tapers in each case over the entire width of the edge region or within the edge region over a distance of at least 1 µm or at least 2 µm or at least 5 µm or at least 10 µm or at least 20 µm or at least 50 µm. Alternatively or additionally, the active layer tapers in each case over a distance of at most 100 µm. In particular, the active layer tapers continuously. For example, the thickness of the active layer at the ends facing the facets is in each case at most 50% or at most 30% or at most 10% of the average thickness of the active layer within the central region. In particular, the average thickness of the active layer in the central region is between 20 nm and 50 nm, inclusive.

According to at least one embodiment, the active layer is spaced apart from one facet or both facets. For example, within an edge region, the active layer is completely removed. Alternatively, the thickness of the active layer continuously decreases from the central region towards the facets, with the active layer completely disappearing at a distance from the facets. For example, the distance of the active layer from one facet, measured in a direction perpendicular to this facet, is at least 1 µm or at least 2 µm or at least 5 µm or at least 10 µm or at least 20 µm or at least 50 µm. Advantageously, a distance of the active layer from the facet allows the power density of the semiconductor laser diode at the facet to be kept particularly low, since electromagnetic radiation is neither emitted nor absorbed there.

According to at least one embodiment, the distance of the active layer to one facet varies along a direction parallel to said facet. For example, the distance varies by at least 30% or at least 50% around an average distance to the facet. For example, the distance varies periodically along a direction parallel to the facet. Advantageously, by varying the distance of the active layer to one facet, a distribution of the power density within the edge region can be predetermined. In doing so, interface effects in the light propagation within the semiconductor laser diode can be specifically prevented or induced. Preferably, the distance of the active layer also varies with respect to the other facet, in which case what has just been said applies accordingly.

According to at least one embodiment, the distance of the active layer to one facet varies linearly. For example, the distance increases or decreases along a direction of the facet, in particular continuously. An interface extending transversely to the active layer between the edge region and central region or between the active layer and the semiconductor layer sequence has, in particular, an angle of at least 70° or at least 75° or at least 84° or at least 88° with a longitudinal side of the semiconductor layer sequence. Alternatively or additionally, the angle is at most 89.9°. A longitudinal side of the semiconductor layer sequence connects in particular the two opposing facets to one another and extends transversely, in particular perpendicularly, to the active layer. For example, the longitudinal side is perpendicular to at least one of the facets. Alternatively or additionally, the angle is at most 89.9°.

Alternatively, the interface is perpendicular to the longitudinal side. In this case, the facet to which the distance of the active layer varies has an angle with respect to the longitudinal side. For example, the angle is at least 70° or at least 75° or at least 84° or at least 88°. Alternatively or additionally, the angle is at most 89.9°. The angle is predetermined, for example, by the growth substrate, for example by its crystal structure. Then, the angle is formed in particular during singulation, in particular during singulation by breaking.

Further, it is possible that the facet and the interface are parallel or substantially parallel to each other. In this case, the facet has, for example, unevennesses, whereby the distance of the facet to the active layer varies. For example, the facet is roughened. Advantageously, further layers, such as mirror layers or passivation layers, can be arranged particularly easily on uneven facets. Preferably, the unevennesses form nucleation seeds for overgrowth of the facet with further layers.

According to at least one embodiment, the edge-emitting semiconductor laser diode comprises two mirrors, wherein the mirrors are arranged on the facets. Preferably, at least one mirror has a reflection coefficient for the radiation generated in the semiconductor layer sequence of at least 90% or at least 95% or at least 99%. The mirrors are, for example, dielectric mirrors. Advantageously, a particularly good laser resonator can be formed by the use of mirrors.

According to at least one embodiment, the semiconductor laser diode comprises passivation layers, which are arranged between the mirrors and the semiconductor layer sequence. In particular, the passivation layers are formed of a crystalline material. For example, the passivation layers comprise or are formed of a II-VI compound material, such as ZnSe. Preferably, the passivation layers are formed of a material having a larger band gap than the active layer. Advantageously, this further increases the distance between the optically active zone of the semiconductor laser diode and the mirrors, thereby increasing the reliability.

For example, the passivation layers passivate and protect the facet of the semiconductor layer sequence. This means that possible reactions of the exposed facets with the environment of the semiconductor layer sequence or, for example, the mirrors are avoided. Advantageously, undesirable interface effects at the facets can thus be avoided.

According to at least one embodiment, the edge-emitting semiconductor laser diode comprises a metallic contact layer for electrically contacting the semiconductor layer sequence. The contact layer is arranged on a side of the semiconductor layer sequence facing away from the growth substrate. The contact layer is spaced apart from the two facets. Preferably, the distance of the contact layer from the facets is at least as large as the lateral distance of the active layer from the facets. In particular, the semiconductor layer sequence can be electrically contacted via the contact layer and, during intended operation, the semiconductor layer sequence is supplied with current via the contact layer. Preferably, the first contact layer comprises a metal, such as gold, silver, aluminum, palladium, platinum, titanium, nickel or consists of one of these materials or a mixture of these materials.

For example, the distance of the contact layer to the facets is at least 5 µm or at least 10 µm or at least 20 µm or at least 50 µm in each case. Alternatively or additionally, the distance of the contact layer to the facets is at most 100 µm in each case. For example, the distance of the contact layer to the facets is in each case at least 1 times or 2 times or 5 times or 10 times the thickness of the semiconductor layer sequence measured perpendicular to the lateral direction. The active layer is supplied with current essentially only in the area of the contact layer. Comparatively little current is impressed in the area of the facets, whereby the power density in these areas is advantageously reduced.

According to at least one embodiment, the semiconductor layer sequence comprises a sacrificial layer, wherein the sacrificial layer is arranged on a side of the active layer facing away from the growth substrate. The sacrificial layer is present in the central region of the semiconductor layer sequence but not in the edge regions. For example, the sacrificial layer has an average thickness between 20 nm and 100 nm inclusive. In particular, the sacrificial layer is formed of a material having a higher etch rate than the rest of the semiconductor layer sequence with respect to a predetermined etchant. For example, the etch rate of the sacrificial layer is at least twice as high or 100 times as high as the etch rate of the rest of the semiconductor layer sequence. Preferably, the sacrificial layer is formed from the same compound semiconductor material as the rest of the semiconductor layer sequence, but differs from it in its exact material composition. For example, the semiconductor layer sequence is substantially based on AlGaAs, with the sacrificial layer having a higher aluminum content than the rest of the semiconductor layer sequence. In this case, the aluminum content of the sacrificial layer may be, for example, between 50% and 90% inclusive. For example, a semiconductor laser diode having a sacrificial layer exhibits a reduction in the thickness of the active layer in the edge region with a particularly low and/or predeterminable gradient. Advantageously, this allows the refractive index of the semiconductor layer sequence in the edge region to be varied in a targeted manner in the direction towards the facets, which can promote light propagation within the semiconductor layer sequence.

According to at least one embodiment, the semiconductor layer sequence comprises an etch stop layer. The etch stop layer is arranged between the growth substrate and the active layer. For example, the etch stop layer has a thickness, measured perpendicular to the main extension plane of the semiconductor layer sequence, between 5 nm and 15 nm inclusive, preferably 10 nm.

The material system of the semiconductor layer sequence may have the components In, Ga, Al, P and As. In particular, the etch stop layer differs from the rest of the semiconductor layer sequence in its material composition. For example, the etch stop layer differs in the concentration of at least one of these components by at least 10%, preferably by at least 30%, more preferably by at least 50% from the rest of the semiconductor layer sequence. For example, the etch stop layer comprises 10% or 30% or 50% more phosphorus than the rest of the semiconductor layer sequence. In particular, the etch stop layer comprises phosphorus while the rest of the semiconductor layer sequence is free of phosphorus. For example, the etch stop layer is formed with GaP or InGaAlP and the rest of the semiconductor layer sequence is formed with GaAs or AlGaAs. Preferably, the material composition of the semiconductor layer sequence changes abruptly in a step-like manner at interfaces between the etch stop layer and the rest of the semiconductor layer sequence.

Further, a method of manufacturing an edge-emitting semiconductor laser diode is specified. In particular, the edge-emitting semiconductor laser diode described herein can be manufactured by such a method. This means that all features disclosed for the edge-emitting semiconductor laser diode are also disclosed for the method, and vice versa.

According to at least one embodiment, the method comprises a step A) in which a first portion of a semiconductor layer sequence is grown on a growth substrate, the first portion comprising an active layer. In particular, the first portion of the semiconductor layer sequence is epitaxially deposited, for example by means of metal organic vapor phase epitaxy, MOVPE for short, or metal organic chemical vapor deposition, MOCVD for short, or by means of molecular beam epitaxy, MBE for short. The first portion is grown, for example, with a thickness of at least 1000 nm measured perpendicular to the main extension plane of the semiconductor layer sequence, the active layer having a thickness between 3 nm and 100 nm inclusive.

According to at least one embodiment, the method comprises, in a method step B), applying a mask layer to a top surface of the first portion of the semiconductor layer sequence facing away from the growth substrate. In particular, the top surface forms a surface of the first portion of the semiconductor layer sequence lying opposite the growth substrate. For example, the mask layer is a photoresist layer.

According to at least one embodiment of the method, in a step C) the mask layer is structured with trenches. In this process, the first portion of the semiconductor layer sequence is exposed within the trenches. For example, the trenches completely disrupt the mask layer in a direction perpendicular to the main extension plane of the active layer. In particular, the structuring of the mask layer is performed by a lithography process. The trenches have main extension directions that are substantially parallel to each other. The extent of the trenches along their main extension directions is, for example, identical to the extent of the semiconductor layer sequence in this direction to within 5%. In particular, the trenches have a width of at least 20 µm and at most 100 µm. "Width" is understood to denote an extent parallel to the main extension plane of the active layer and perpendicular to the main extension direction of the trenches.

According to at least one embodiment of the method, an etching process is carried out in a method step D), wherein an etchant is introduced into the trenches and the active layer is at least partially etched away in the region of the trenches. In particular, etching is performed in the region of the trenches until through the active layer. For example, the first portion is etched using wet chemical etching. The etchant is then, for example, an acid such as $H_3PO_4$ or $H_2SO_4$, or a base such as $NH_3$. Additionally, an oxidizing agent, for example $H_2O_2$, is added to the etchant. Alternatively, the first portion is etched by dry chemical etching. Advantageously, a ratio of the etch rate of the active layer to the rest of the semiconductor layer sequence can be adjusted by a suitable choice of the etchant and/or its concentration.

According to at least one embodiment, the mask layer is removed in a method step E). In particular, the entire surface of the first portion of the semiconductor layer sequence facing away from the growth substrate is cleaned. This surface is then in particular substantially free of material which is not part of the semiconductor layer sequence. The cleaning is carried out, for example, by water, acetone or isopropanol. If an oxidizing agent such as $H_2O_2$ is used in method step D), the first portion of the semiconductor layer sequence is heated, for example in a growth reactor, whereby the oxide on the surface is removed. In this case, providing an increased supply of arsenic may enhance the removal of the oxide. Furthermore, in the case of MOVPE growth, the surface to be cleaned may be etched by providing $CBr_4$ to remove the oxide.

According to at least one embodiment of the method, in a method step F) a second portion of the semiconductor layer sequence is grown over the entire surface of the side of the first portion of the semiconductor layer sequence facing away from the growth substrate. In this process, the semiconductor layer sequence is completed. For example, the second portion of the semiconductor layer sequence is grown using the same processes as used for the first portion. In particular, the material of the second portion is based on the same material as the first portion.

According to at least one embodiment of the method, in a step G) the semiconductor layer sequence and the growth substrate are cut through in the region of the active layer etched in step D), the cut surfaces forming facets of the semiconductor laser diode. For example, a break line is predetermined by a suitable method, at which the semiconductor layer sequence and the growth substrate are then broken.

One of the advantages of the method described here is that the growth process of the semiconductor layer sequence is interrupted after step A). In the following, only a part of the first portion of the semiconductor layer sequence is etched. Thereby, the discrepancy of the thickness of the first portion in the regions where etching has been performed and the regions where etching has not been performed is kept small. By growing the second portion of the semiconductor layer sequence in step F), this discrepancy can be compensated by a suitable choice of the growth parameters. For example, the ratio of the third and fifth main group elements of the III-V compound semiconductor material provided during the growth process is a suitable parameter. It is thus a so-called two-step epitaxial process. Thus, advantageously, thickness differences that negatively affect the wave propagation of electromagnetic radiation within the semiconductor layer sequence can be reduced. At the same time, the active layer can be at least partially removed in the area of the facets.

According to at least one embodiment of the method, after step A), the active layer is spaced apart from the top surface by at most 100 nm or at most 75 nm or at most 50 nm. Preferably, the distance of the active layer from the top surface is between 5 nm and 20 nm inclusive. For example, the top surface is part of the active layer. Advantageously, only a small etching depth is then required in method step D) to remove the active layer. As a result, a particularly small difference in the thickness of the first portion between etched and unetched regions can be achieved. Advantageously, a small difference can be compensated particularly well in method step F).

According to at least one embodiment of the method, a mirror is arranged on each of the facets in a further method step. In particular, the mirrors are arranged directly on the facets.

According to at least one embodiment of the method, in a further method step, a passivation layer is grown onto each of the facets. For example, the passivation layer is grown epitaxially. In particular, after this method step, the semiconductor layer sequence is in direct contact with the passivation layer. The growth of the passivation layer takes place, for example, tilted at an angle between 85° and 95° inclusive, preferably 90°, with respect to the growth of the first and second portions of the semiconductor layer sequence. The growth of the passivation layer may be performed using the same epitaxial methods as used for the growth of the semiconductor layer sequence, preferably using MBE. A method comprising the growing of a passivation layer is a so-called three-step epitaxial method. Advantageously, by growing a passivation layer on a facet, said facet can be particularly well protected against environmental influences, whereby interface effects can be reduced.

According to at least one embodiment of the method, etching edges are formed in the first portion of the semiconductor layer sequence in step D), wherein the etching edges each enclose an angle of less than 90°, for example at most 45° or at most 30° or at most 2°, with the main extension plane of the active layer. In particular, the active layer adjoins the etching edges. For example, the first portion is not only removed in the region of the trenches of the mask layer, but the etchant also spreads laterally, that is parallel to the main extension plane of the active layer. In particular, the etching edge can be specifically influenced via the choice of the type and composition of the etchant. Advantageously, the propagation of the electromagnetic radiation within the semiconductor layer sequence can be specifically influenced by a suitable choice of the etching edge.

According to at least one embodiment of the method, the first portion comprises a sacrificial layer on a side of the active layer facing away from the growth substrate, the sacrificial layer being formed with a material composition having a higher etch rate, in particular in the lateral direction, for the etchant used in step D) than that of the active layer. For example, the sacrificial layer is grown during step A) with a thickness between 20 nm and 100 nm inclusive. For example, the etch rate of the sacrificial layer, in particular laterally, is at least 1.5 times or at least 2 times or at least 100 times greater than the etch rate of the active layer. Due to the higher etch rate of the sacrificial layer, the sacrificial layer is removed faster than the active layer in method step D). Thus, for example, a particularly flat etching edge, of for example at most 45° or at most 15° or at most 2°, can be obtained. Preferably, the etching edge can be defined particularly precisely by selecting a suitable etchant in combination with a suitable sacrificial layer.

According to at least one embodiment of the method, the mask layer is structured in method step C) with trenches of respectively varying width along a respective main extension direction of the trenches. In the present context, the width of the trench is an extent of the trench perpendicular to the main extension direction. For example, the width varies in a range between 20 μm and 100 μm inclusive. For example, the width varies periodically along the main extension direction, for example by at least 30% or at least 50% around an average width of the trench.

According to at least one embodiment of the method, the first portion of the semiconductor layer sequence comprises an etch stop layer, wherein in step D) etching is carried out up to the etch stop layer but not through the etch stop layer. For example, the etch stop layer is formed of a material which, unlike the material of the rest of the semiconductor layer sequence, is not attacked by the etchant used in step D). Thus, the etch stop layer provides a limit up to which the first portion can be etched. For example, the active layer is based on GaAs and the etch stop layer is based on GaP. Advantageously, a particularly homogeneous removal of the active layer in step D) can be achieved by means of an etch stop layer.

According to at least one embodiment of the method, method steps A) to G) are carried out in the order indicated.

BRIEF DESCRIPTION OF THE DRAWINGS

Further advantages and advantageous embodiments and further developments of the edge-emitting semiconductor laser diode will become apparent from the following exemplary embodiments shown in connection with schematic drawings. Identical elements, elements of the same kind or elements having the same effect are provided with the same reference signs in the figures. The figures and the proportions of the elements shown in the figures are not to be regarded as true to scale. Rather, individual elements may be shown exaggeratedly large for better representability and/or for better comprehensibility.

In the figures:

FIGS. 3, 4A-4B, 5A-5B, 6, 7, 8A-8B, 9, 10, 11A-11C, 12A-12C, and 13A-13C show different positions in exemplary embodiments of the method of manufacturing an edge-emitting semiconductor laser diode.

DETAILED DESCRIPTION OF ILLUSTRATIVE EMBODIMENTS

Figure 1:
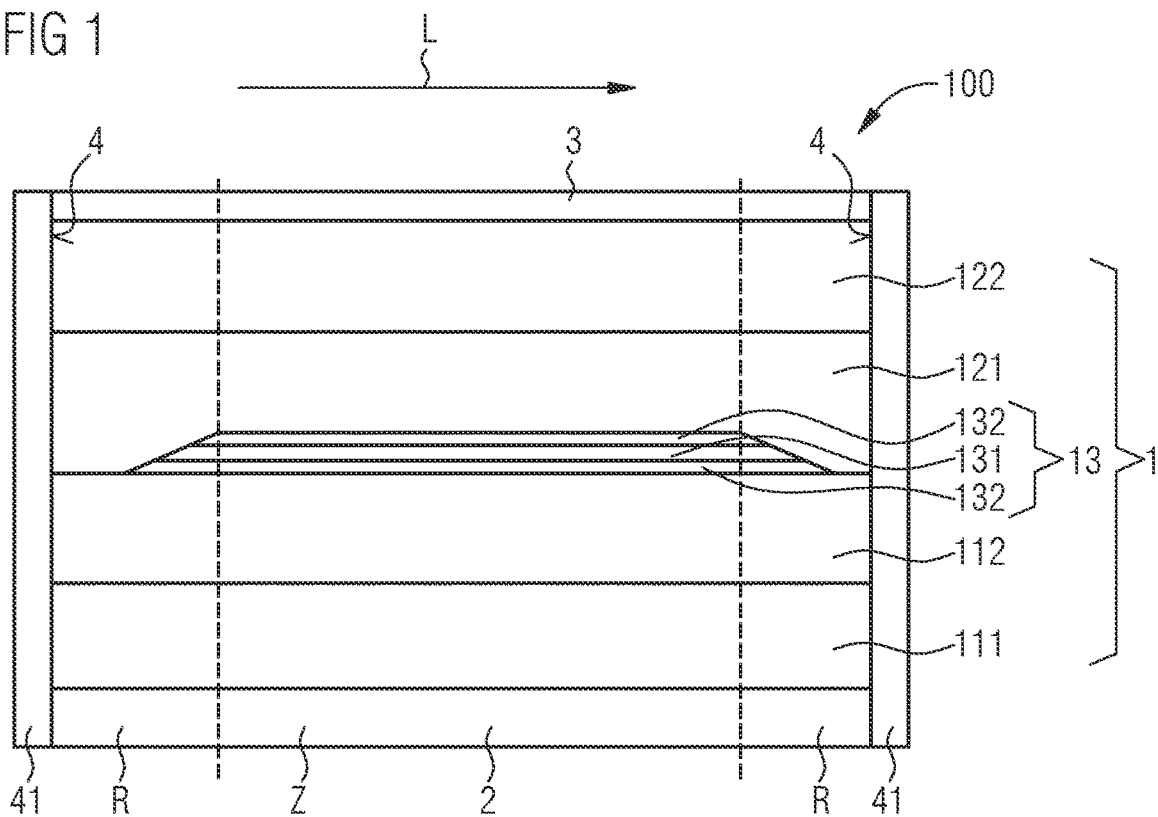
FIGS. 1 and 2 show sectional views of various exemplary embodiments of the edge-emitting semiconductor laser diode.

FIG. 1 shows a schematic sectional view of a first exemplary embodiment of an edge-emitting semiconductor laser diode 100. The semiconductor laser diode 100 comprises a growth substrate 2 on which a semiconductor layer sequence 1 is grown. A metallic contact surface 3 is arranged on the side of the semiconductor layer sequence 1 opposite the growth substrate 2. In the intended operation, the contact surface 3 serves for electrical contacting of the semiconductor layer sequence 1 and for energizing the same.

The semiconductor layer sequence 1 comprises a first cladding layer 111, a first waveguide layer 112, an active layer 13, a second waveguide layer 121, and a second cladding layer 122. The semiconductor layer sequence 1 is formed, for example, of a III-V compound semiconductor material, in particular AlGaAs. The growth substrate 2 is formed, for example, of a semiconductor material such as GaAs. The growth substrate 2 as well as the first cladding layer 111, the first waveguide layer 112, the second waveguide layer 121, and the second cladding layer 122 may be doped. For example, the growth substrate is n-doped. Preferably, in this case, the first cladding layer and the first waveguide layer are also n-doped. Then, the second waveguide layer 121 and the second cladding layer 122 are p-doped. Alternatively, the doping may be reversed.

In the present exemplary embodiment, the active layer 13 comprises a quantum well 131 and two secondary wells 132. The secondary wells 132 are formed, for example, of AlGaAs. In particular, the quantum well 131 comprises InGaAs. In particular, the quantum well 131 is the only layer of the semiconductor layer sequence 1 that contains indium.

In a lateral direction L, which runs parallel to the main extension plane of the semiconductor layer sequence 1, the semiconductor layer sequence 1 is bounded by two facets 4 located opposite each other. The facets 4 thus form lateral surfaces of the semiconductor layer sequence 1. The facets 4 extend in particular transversely, preferably perpendicularly, to the main extension plane of the semiconductor layer sequence 1.

In the present exemplary embodiment, mirrors 41 are attached to the facets 4. The mirrors 41 are, for example, dielectric mirrors. The region between the mirrors 41 is a laser resonator, wherein the semiconductor layer sequence 1 functions as a laser medium.

The edge-emitting semiconductor laser diode wo shown in FIG. 1 comprises two edge regions R and a central region Z arranged between and adjacent to the edge regions R. The edge regions R adjoin the facets 4. Within each of the edge regions R, the volume fraction of the active layer 13 in the semiconductor layer sequence 1 is smaller than in the central region Z. In particular, the active layer 13 is retracted from the facets 4 in each case and is spaced apart from the facets 4. Further, the edge regions R and the central region Z have the same extent in all directions except for the lateral direction L. Virtual partition lines (indicated as dashed lines) between the edge regions R and the central region Z are perpendicular to the lateral direction L. In the present case, the reduced volume fraction results, inter alia, from a reduced thickness of the active layer 13 within the edge regions R, compared to the average thickness of the active layer 13 in the central region. Moreover, the active layer 13 tapers within the edge regions R in the direction towards the facets 4.

Figure 2:
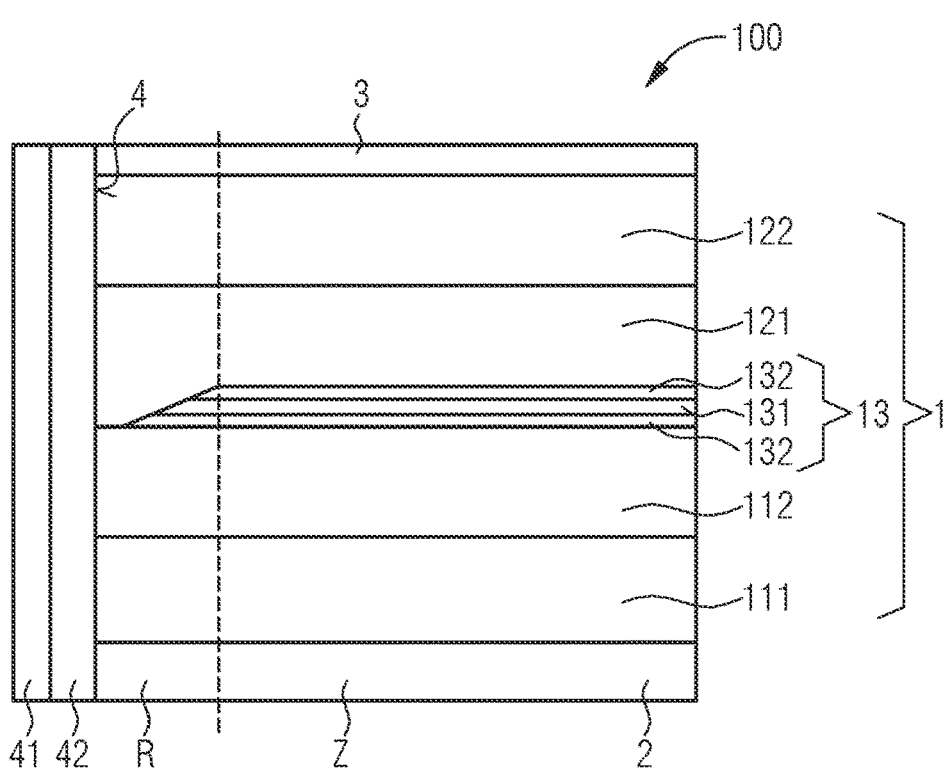

FIG. 2 shows a detail of a second exemplary embodiment of an edge-emitting semiconductor laser diode 100. The detail shows the edge-emitting semiconductor laser diode wo in the area of a facet 4 and otherwise shows essentially the same features as the semiconductor laser diode 100 of FIG. 1. In contrast to the exemplary embodiment of FIG. 1, however, a passivation layer 42 is also arranged between the facet 4 and the mirror 41. The passivation layer 42 is formed, for example, from ZnSe.

Figure 3:
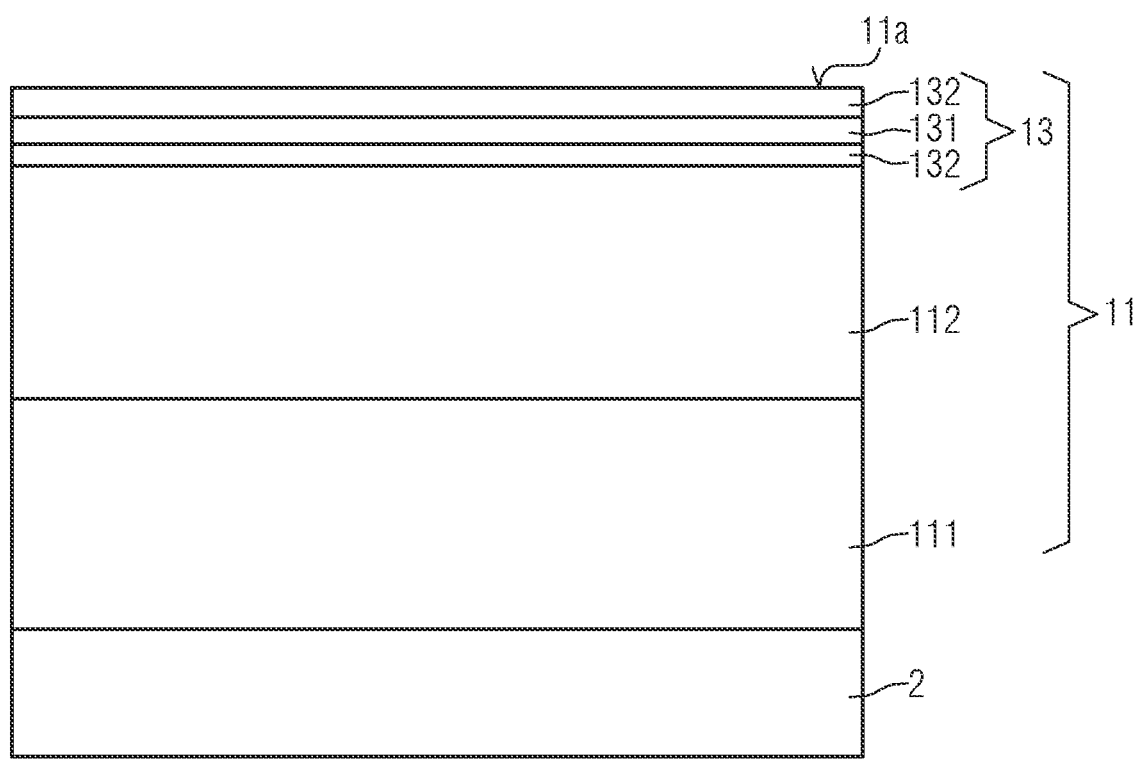

FIG. 3 shows a first position in an exemplary embodiment of the method described herein in a schematic sectional view. In a method step A), a first portion 11 of a semiconductor layer sequence 1 has been grown on a growth substrate 2. The first portion 11 comprises a first cladding layer 111, a first waveguide layer 112, and an active layer 13 having a quantum well structure 131 and secondary well structures 132. In the present exemplary embodiment, the side of the active layer 13 lying opposite the growth substrate 2 forms a top surface 11a. The growth substrate 2 is, for example, a wafer comprising a semiconductor material such as GaAs. In particular, the first portion 11 of the semiconductor layer sequence 1 is based on a semiconductor compound material, such as AlGaAs. The growth substrate 2, the first cladding layer 111 and the first waveguide layer 112 are presently n-doped.

Figure 4A:
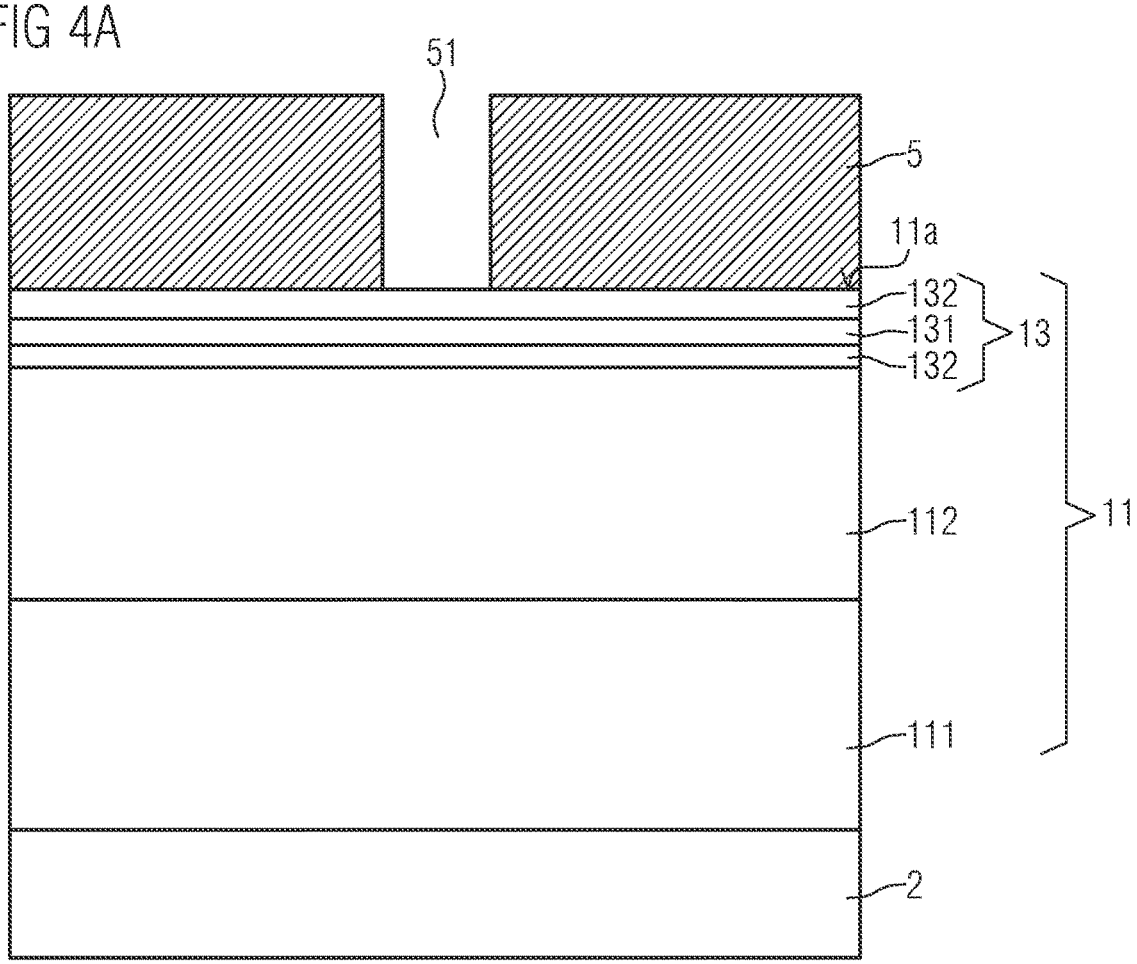

FIG. 4A shows a second position in the method. First, in a method step B), a mask layer 5 was applied to a top surface 11a of the first portion 11 facing away from the growth substrate 2. In particular, the mask layer 5 is a photoresist layer. Subsequently, in a method step C), the mask layer 5 was structured. As a result of the structuring, the mask layer 5 has a trench 51. In the region of the trench 51, the first portion 11 is exposed.

Figure 4B:
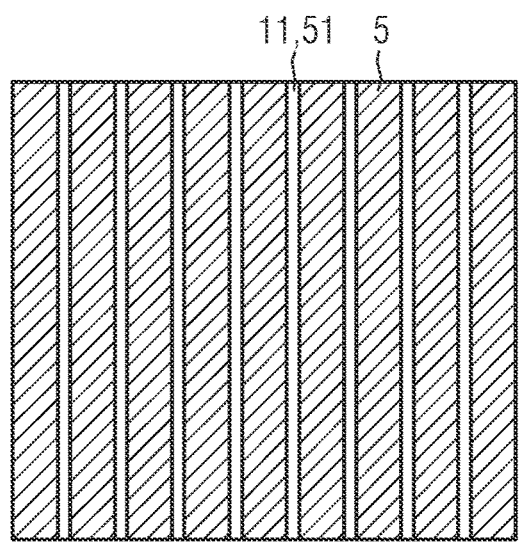

FIG. 4B shows a top view of the mask layer 5 of the product of FIG. 4A. The trenches 51 each have a width perpendicular to their respective main extension direction of, for example, between 5 μm and 100 μm inclusive.

Figure 5A:
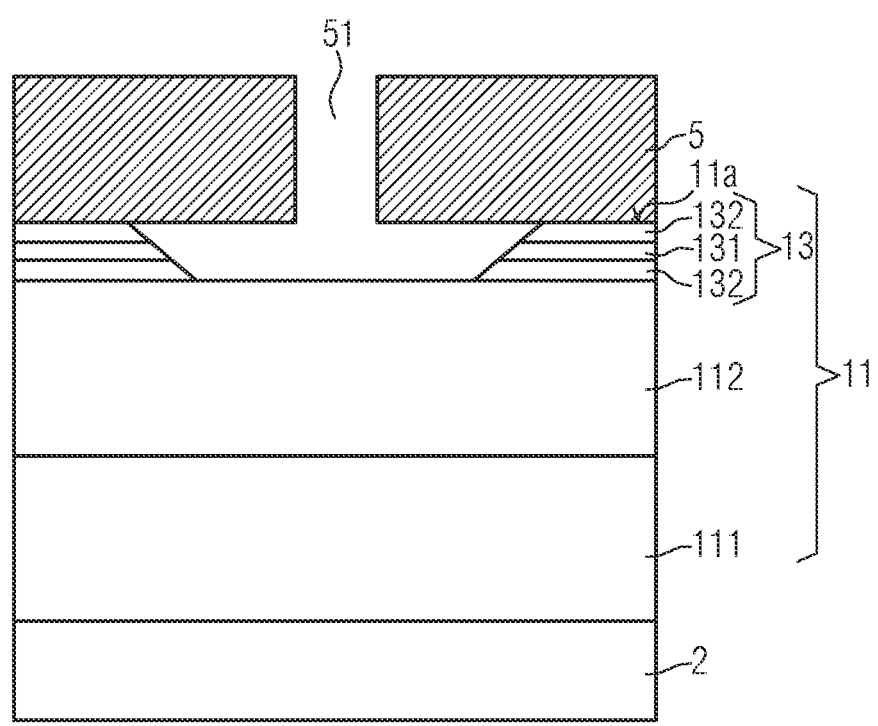

FIG. 5A shows a third position in the method again as a sectional view of the first portion 11. In a method step D), the first portion 11 was etched. An etchant was applied to the top surface 11a of the first portion 11 through the trench 51. Subsequently, the first portion 11 was etched until through the active layer 13. The area where the active layer 13 was removed has a greater width than the trench 51. Within the etched area, the active layer 13 has etching edges adjacent to the active layer 13 and extending transversely, at an angle of less than 90°, to the main extension plane of the active layer 13.

Figure 5B:
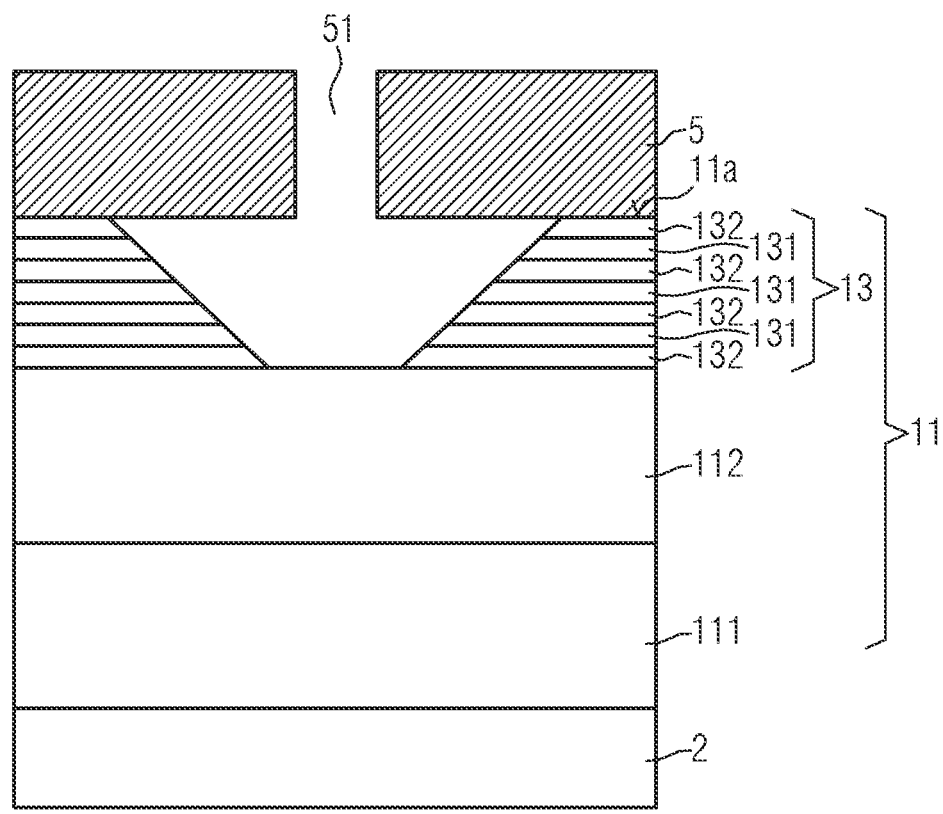

FIG. 5B shows an alternative position in the method to that shown in FIG. 5A. FIG. 5B shows substantially all of the features of FIG. 5A except that the active layer 13 comprises a plurality of quantum well structures 131. The active layer 13 further comprises a plurality of secondary well structures 132. The quantum well structures 131 and the secondary well structures 132 are arranged alternately.

Figure 6:
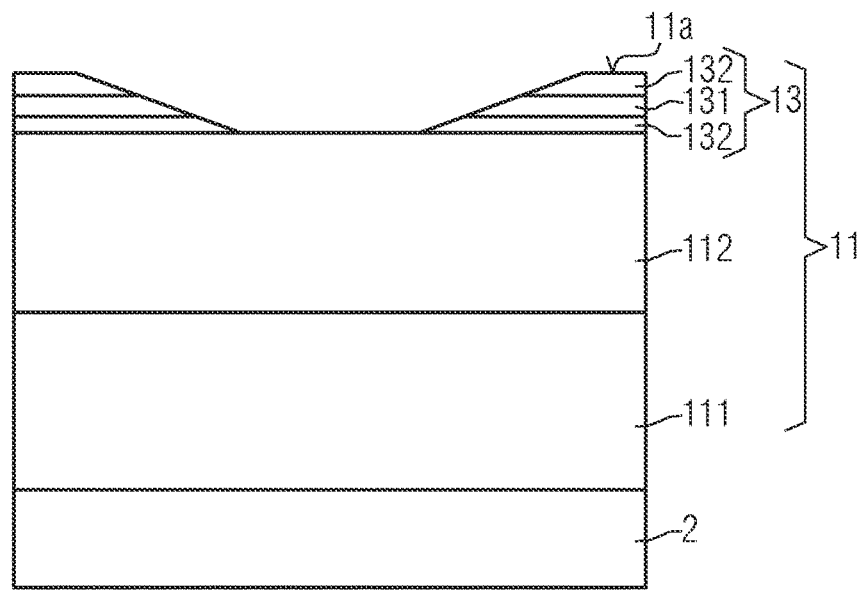

FIG. 6 shows a further position in the method according to a first exemplary embodiment. In particular, the method was continued subsequently to the position of FIG. 5A. Here, in a step E), the mask layer 5 was removed from the top surface 11a of the first portion 11.

Figure 7:
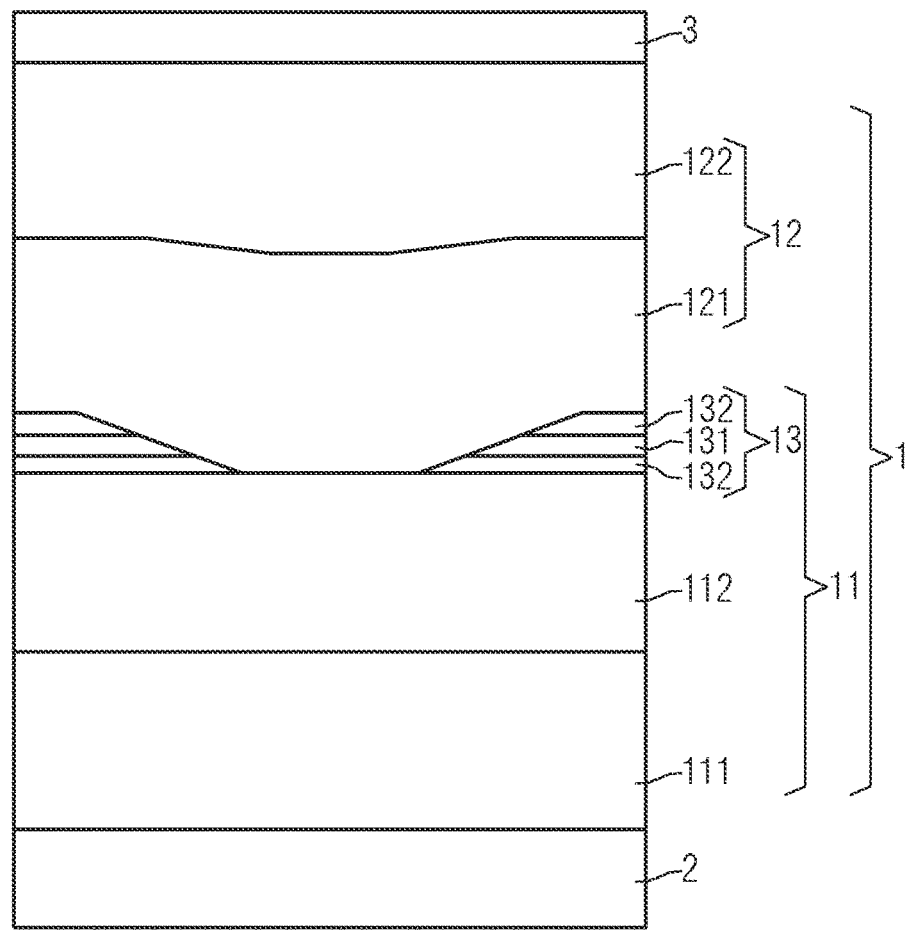

FIG. 7 shows a position in the method after a method step F) has been carried out. In this method step, a second portion 12 was grown over the entire surface of the side of the first portion 11 of the semiconductor layer sequence 1 facing away from the growth substrate 2. By this process, the semiconductor layer sequence 1 was completed. The second portion 12 comprises a second waveguide layer 121 and a second cladding layer 122, the second waveguide layer 121 being arranged between the active layer 13 and the second cladding layer 122. For example, the second waveguide layer 121 is based on the same material as the first waveguide layer 112, but has a different doping. In the present case, the second waveguide layer 121 is p-doped. The second cladding layer 122 and the first cladding layer 111 are related to each other in the same way. In the present case, a metallic contact layer 3 has further been provided on the side of the second portion 12 facing away from the growth substrate 2.

Figure 8A:
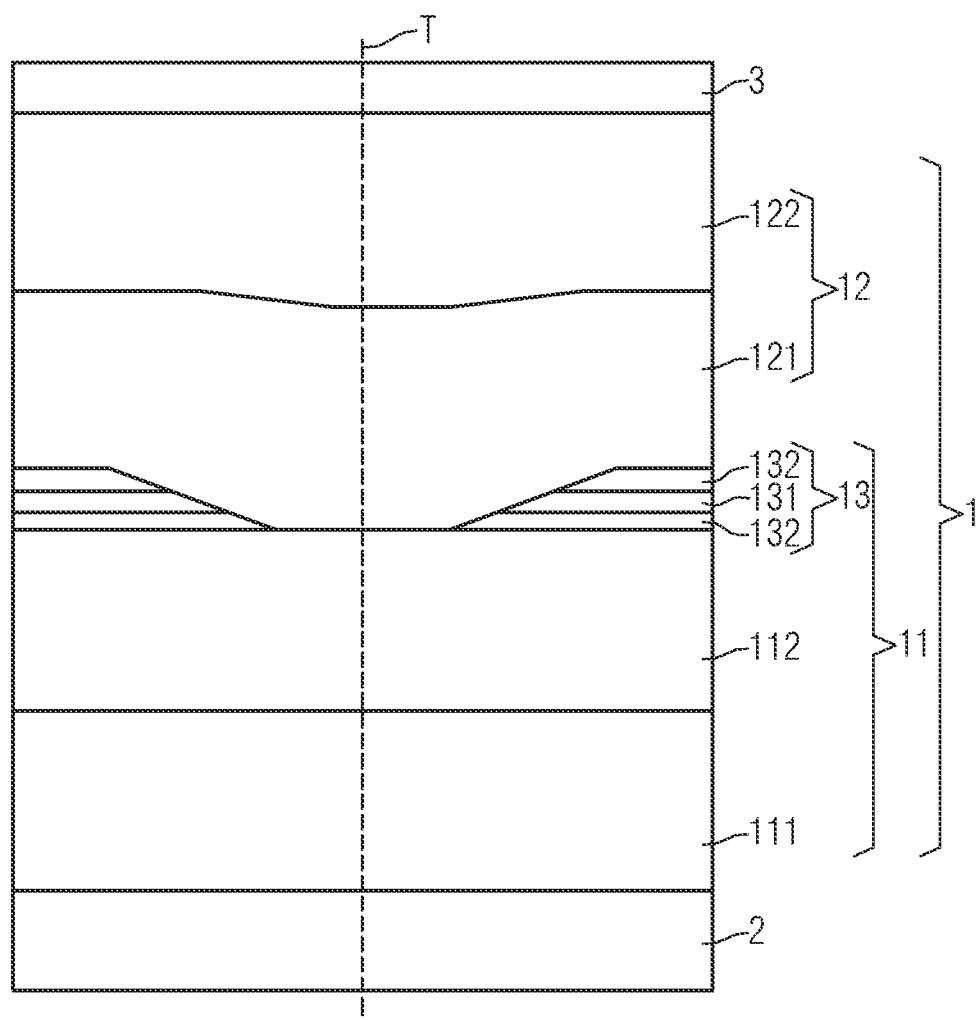

FIG. 8A shows another position in the method. In a method step G), the semiconductor layer sequence 1 as well as the growth substrate 2 and the contact layer 3 are cut through along a separation line T. The separation line T is perpendicular to the main extension direction of the semiconductor layer sequence 1 in the region in which the first portion 11 was etched during method step D).

Figure 8B:
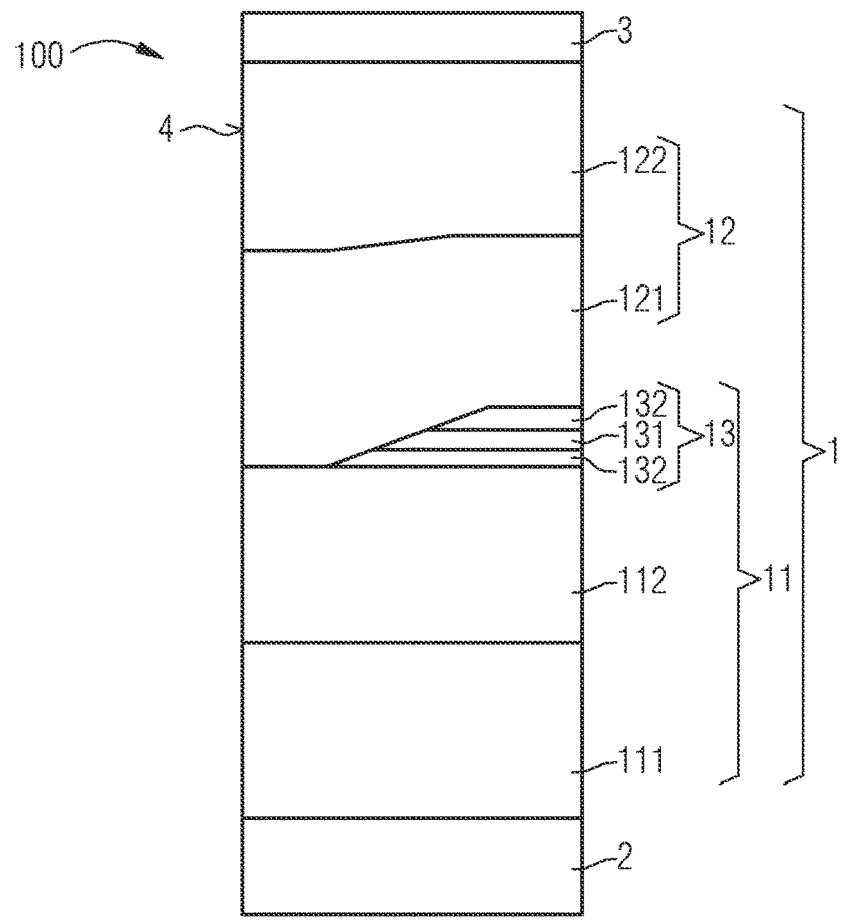

In FIG. 8B, the product of FIG. 8A is shown after performing method step G). After the semiconductor layer sequence 1, the growth substrate 2 and the contact layer 3 have been cut through, the resulting cut surface forms a facet 4 of a semiconductor laser diode 100. FIG. 8B thus corresponds to a section of a finished semiconductor laser diode 100.

Figure 9:
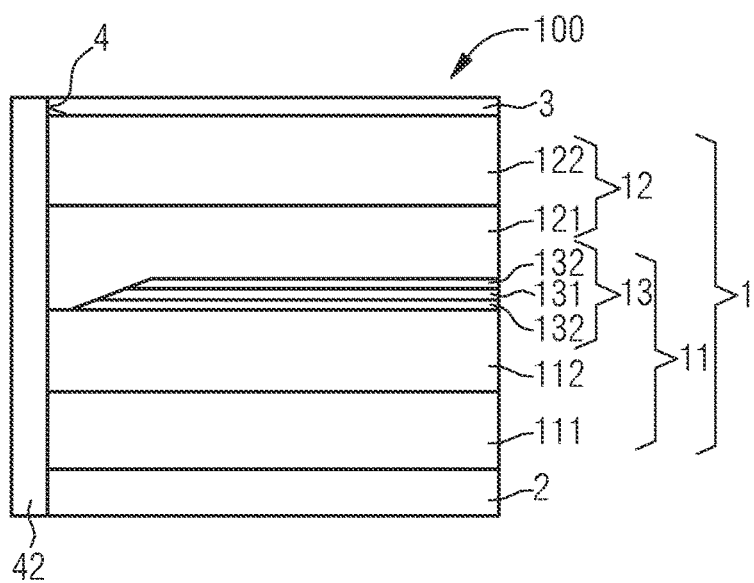

In FIG. 9, the edge-emitting semiconductor laser diode 100 of FIG. 8 is shown after performing another optional method step. In this method step, a passivation layer 42 was epitaxially grown on the facet 4. For example, the passivation layer 42 comprises ZnSe.

Figure 10:
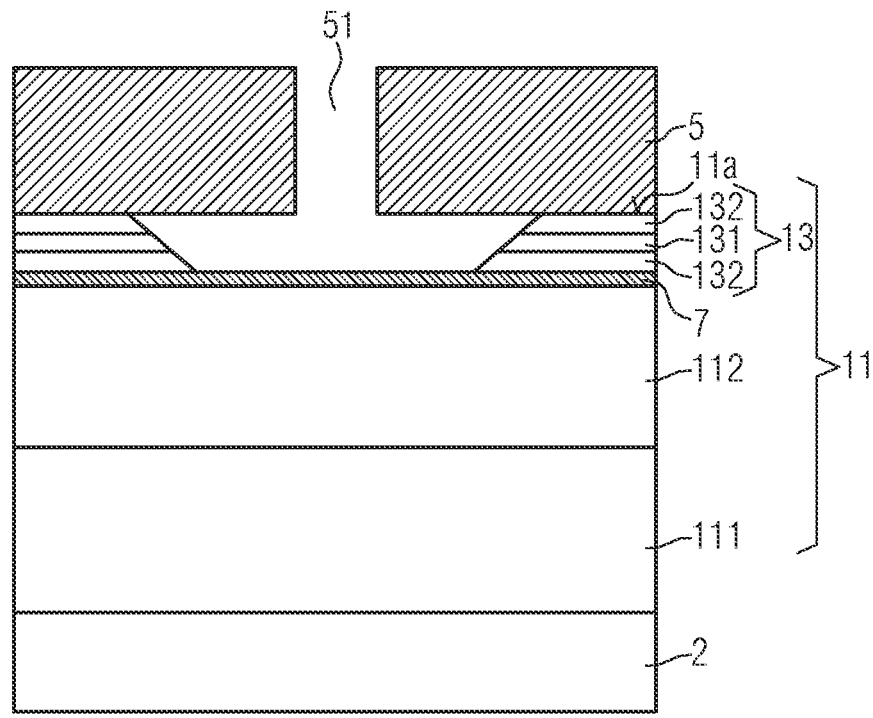

FIG. 10 shows a position in the method according to a second exemplary embodiment. In FIG. 10, substantially the same features are shown as in FIG. 5A, except that the first portion 11 comprises an etch stop layer 7. The etch stop layer 7 is based, for example, on GaP or InGaP. In particular, the etch stop layer 7 is substantially non-ablatable by means of the etchant used in method step D).

Figure 11A:
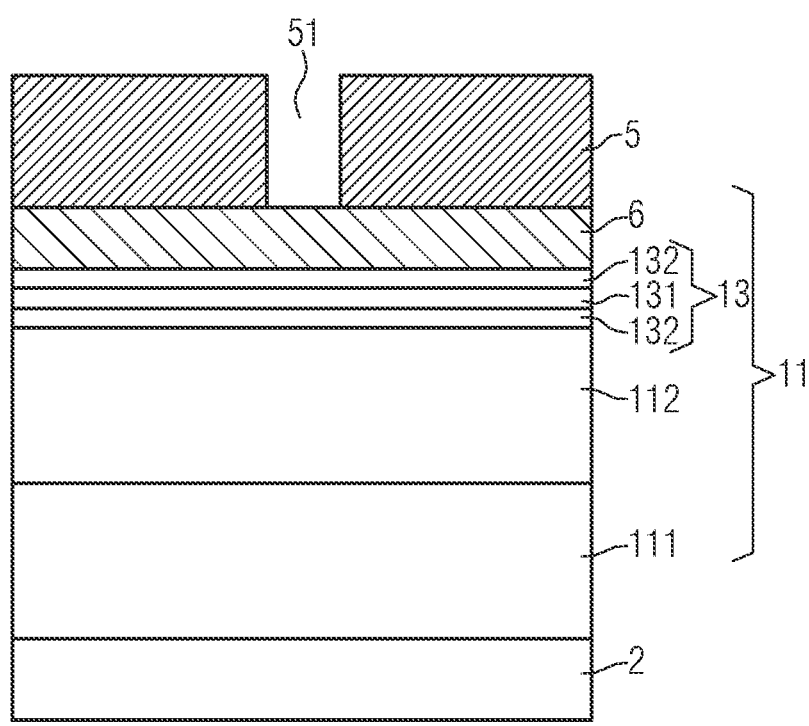

FIG. 11A shows a product after carrying out a method step C) according to a further exemplary embodiment of the method. In contrast to the product of FIG. 4A, a sacrificial layer 6 was grown within method step A) on the side of the active layer 13 facing away from the growth substrate 2. The sacrificial layer 6 has, for example, a thickness between 20 nm to 100 nm inclusive. Preferably, the sacrificial layer is formed of the same material as the first cladding layer 111 and the first waveguide layer 112, presently of AlGaAs. In particular, however, the sacrificial layer has a higher aluminum content than the rest of the first portion 11. In particular, the sacrificial layer 6 has a higher etch rate than the active layer 13.

Figure 11B:
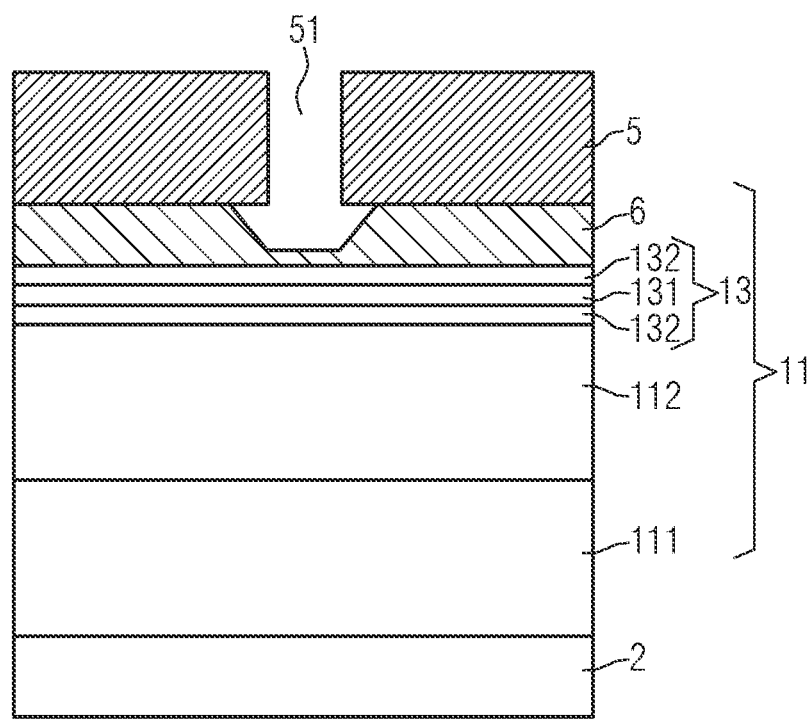

In FIG. 11B, the product of FIG. 11A is shown during performance of a method step D). An etchant is filled into the trench 51 of the mask layer 5. The etchant has already etched away part of the sacrificial layer 6, but has not yet penetrated to the active layer 13.

Figure 11C:
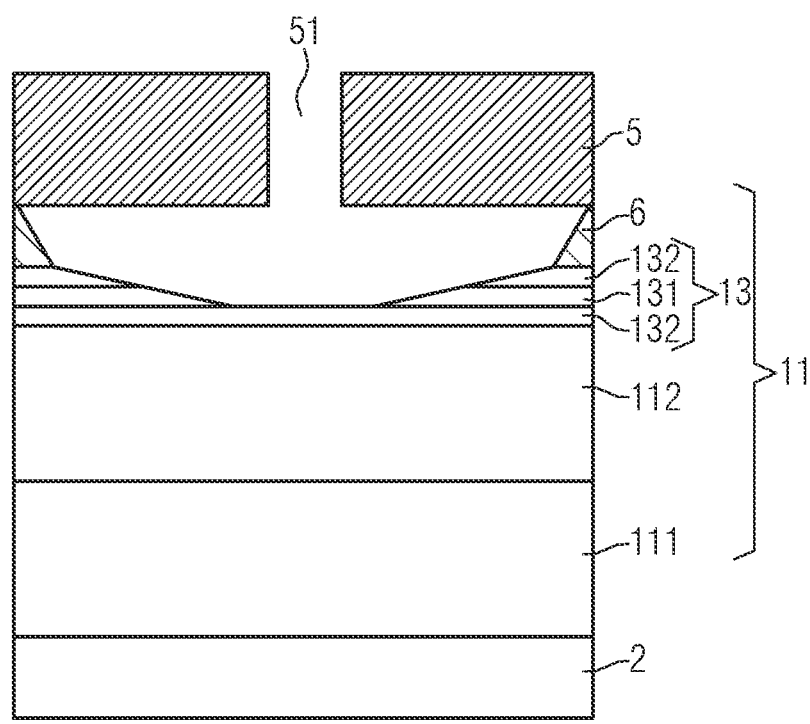

FIG. 11C shows the product of FIG. 11B after method step D) has been completed. In the detail shown, a large portion of the sacrificial layer 6 has been removed. In comparison with FIG. 5A, it can be seen that the etching edge of the active layer is significantly flatter due to the sacrificial layer. This is in particular a consequence of the lateral widening of the etching area as shown in FIG. 11B.

Figure 12A:
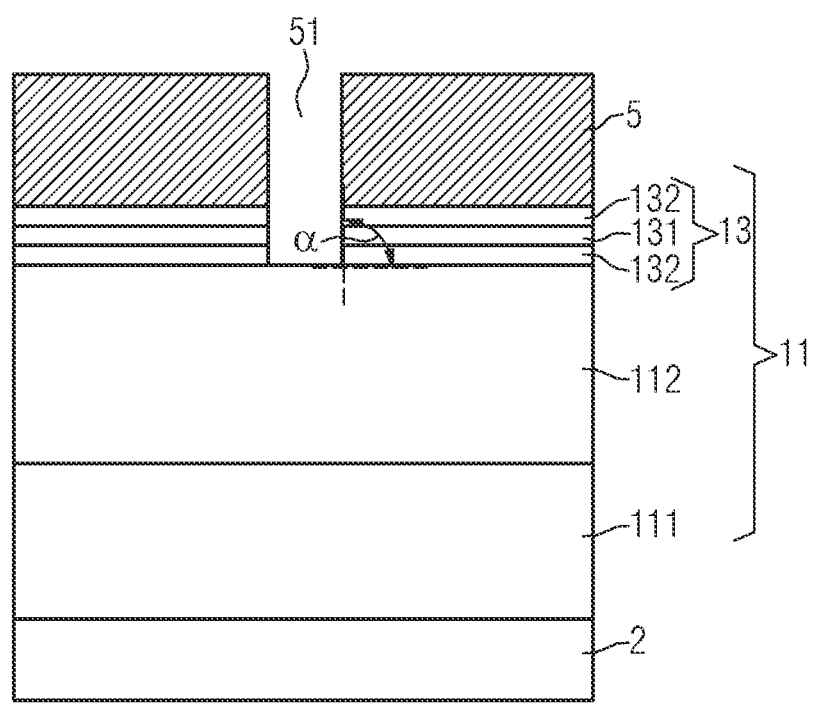

FIG. 12A shows a product after carrying out a method step D) according to a further exemplary embodiment of the method. Essentially the same features are shown in FIG. 12A as in FIG. 5A, with the difference that the etching edge has an angle α with respect to the main extension plane of the active layer 13, which is 90° within the manufacturing accuracy. For example, for this purpose, in step D), a suitable etchant was chosen which has a negligible lateral etch rate.

Figure 12B:
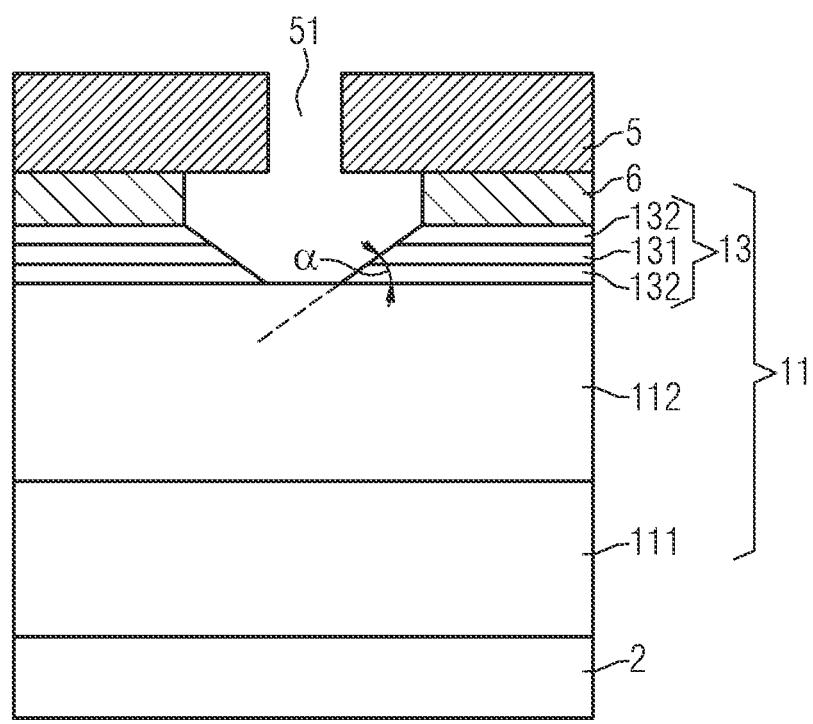

FIG. 12B shows a product after carrying out a method step D) according to a further exemplary embodiment of the method. In contrast to the product of FIG. 11C, the etching edge has an angle α to the main extension plane of the active layer 13 of between 40° and 50° inclusive. For example, a different etchant was chosen for the product of FIG. 12B than for the product of FIG. 11C. Alternatively or additionally, the material composition of the sacrificial layer 6 has been selected such that a predetermined ratio of the etch rates of the sacrificial layer 6 and the active layer 13 is achieved. By specifically selecting the ratio of the etch rates and/or the etchant, the angle α of the etching edge can be predetermined.

FIG. 12C shows a product after a step D) of the method has been carried out. Substantially the same features are shown in FIG. 12C as in FIG. 12B, except that the etching edge has an angle α which is flatter than the angle α of FIG. 12B. For example, the angle is between 15° and 30° inclusive. For example, a different etchant was selected in step D) of the method. Alternatively, the material composition of the sacrificial layer 6 was adjusted.

In FIG. 13A, a product is shown in plan view after carrying out a method step C) according to a further exemplary embodiment of the method. A trench 51 of the mask layer 5 can be seen after the mask layer 5 has been structured. The first portion 11 has been exposed in the region of the trench 51. The trench has a main extension direction through which, in a later method step, the separation line T extends. Further, the trench has a width perpendicular to the main extension direction. The width is constant along the main extension direction in FIG. 13A.

In FIG. 13B, a product at the same stage of the method as in FIG. 13A is shown. Both products have substantially the same features with the difference that the width of the trench 51 in FIG. 13B varies along the main extension direction of the trench 51. The width varies periodically and with variations in the width of at least 30% of the average width.

The product of FIG. 13C has substantially the same features as the product of FIG. 13B except that the width of the trench 51 varies in a zigzag manner.

The invention is not limited to the exemplary embodiments by the description based thereon. Rather, the invention encompasses any new feature as well as any combination of features, which in particular includes the combination of features in the patent claims, even if this feature or combination itself is not explicitly indicated in the patent claims or exemplary embodiments.

The invention claimed is:

1. An edge-emitting semiconductor laser diode comprising:
   a growth substrate;
   a semiconductor layer sequence located on the growth substrate, the semiconductor layer sequence having an active layer and an etch stop layer; and
   two facets located opposite each other,
   wherein the facets bound the semiconductor layer sequence in a lateral direction,
   wherein the semiconductor layer sequence comprises two edge regions adjoining the facets and a central region directly adjoining both edge regions,
   wherein, within each of the edge regions, a volume fraction of the active layer in the semiconductor layer sequence is smaller than in the central region,
   wherein the active layer is spaced apart from one facet,
   wherein a distance of the active layer to the facet varies along a direction parallel to this facet and perpendicular to a growth direction of the semiconductor layer sequence, and
   wherein the etch stop layer is arranged between the growth substrate and the active layer.

2. The edge-emitting semiconductor laser diode according to claim 1, wherein the semiconductor layer sequence has an average thickness within each of the edge regions which differs from an average thickness in the central region by at most 50 nm.

3. The edge-emitting semiconductor laser diode according to claim 1, wherein the active layer tapers in each case in the direction towards the facets.

4. The edge-emitting semiconductor laser diode according to claim 1, further comprising two mirrors arranged on the facets.

5. The edge-emitting semiconductor laser diode according to claim 4, further comprising passivation layers arranged between the mirrors and the semiconductor layer sequence.

6. The edge-emitting semiconductor laser diode according to claim 1, further comprising a metallic contact layer for electrically contacting the semiconductor layer sequence, wherein the metallic contact layer is arranged on a side of the semiconductor layer sequence facing away from the growth substrate, and wherein the metallic contact layer is spaced apart from the two facets.

7. The edge-emitting semiconductor laser diode according to claim 1,
wherein the semiconductor layer sequence comprises a sacrificial layer,
wherein the sacrificial layer is arranged on a side of the active layer facing away from the growth substrate, and
wherein the sacrificial layer is present in the central region of the semiconductor layer sequence but not in the edge regions.

8. The edge-emitting semiconductor laser diode according to claim 1,
wherein the semiconductor layer sequence is based on an $Al_nIn_{1-n-m}Ga_mAsP$ material system, with $0 \leq n \leq 1$, $0 \leq m \leq 1$, and $m+n \leq 1$, and
wherein material compositions of the etch stop layer and the rest of the semiconductor layer sequence differ by at least 10% in a concentration of at least one of In, Ga, Al, P, or As.

9. A method for manufacturing an edge-emitting semiconductor laser diode, the method comprising:
growing a first portion of a semiconductor layer sequence on a growth substrate, the first portion comprising an active layer with a top surface;
applying a mask layer to the top surface of the first portion of the semiconductor layer sequence facing away from the growth substrate;
structuring the mask layer with trenches, exposing the first portion of the semiconductor layer sequence within the trenches;
performing an etching process, wherein an etchant is introduced into the trenches and the active layer is at least partially etched away in a region of the trenches;
removing the mask layer;
growing a second portion of the semiconductor layer sequence over an entire surface of a side of the first portion of the semiconductor layer sequence facing away from the growth substrate thereby completing the semiconductor layer sequence; and
cutting through the semiconductor layer sequence and the growth substrate in a region of the active layer etched away, wherein cut surfaces form facets of the edge-emitting semiconductor laser diode.

10. The method according to claim 9, further comprising arranging a mirror on each of the facets.

11. The method according to claim 9, further comprising growing a passivation layer onto each of the facets.

12. The method according to claim 9, wherein performing the etching process comprises forming etching edges in the first portion of the semiconductor layer sequence, each etching edge enclosing an angle of less than 90° with a main extension plane of the active layer.

13. The method according to claim 9, wherein the first portion comprises a sacrificial layer on a side of the active layer facing away from the growth substrate, and wherein the sacrificial layer is formed of a material composition having a higher etch rate for the etchant than that of the active layer.

14. The method according to claim 9, wherein structuring the mask layer comprises structuring the mask layer with the trenches of respectively varying width along a respective main extension direction of the trenches.

15. The method according to claim 9, wherein the first portion of the semiconductor layer sequence comprises an etch stop layer, and wherein performing the etching process comprises etching up to the etch stop layer but not through the etch stop layer.

16. The method according to claim 9, wherein the method is carried out in the order stated.

* * * * *